(12) United States Patent
Ding

(10) Patent No.: US 11,357,121 B2
(45) Date of Patent: Jun. 7, 2022

(54) FOLDABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Feng Ding, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 113 days.

(21) Appl. No.: 16/968,894

(22) PCT Filed: Jul. 21, 2020

(86) PCT No.: PCT/CN2020/103158
§ 371 (c)(1),
(2) Date: Aug. 11, 2020

(87) PCT Pub. No.: WO2021/258461
PCT Pub. Date: Dec. 30, 2021

(65) Prior Publication Data
US 2021/0410307 A1 Dec. 30, 2021

(30) Foreign Application Priority Data
Jun. 24, 2020 (CN) .......................... 202010590980.0

(51) Int. Cl.
H05K 5/02 (2006.01)
G06F 1/16 (2006.01)
H05K 5/00 (2006.01)

(52) U.S. Cl.
CPC ......... *H05K 5/0226* (2013.01); *G06F 1/1641* (2013.01); *G06F 1/1652* (2013.01); *H05K 5/0017* (2013.01)

(58) Field of Classification Search
CPC .... G06F 1/1652; G06F 1/1641; G06F 1/1616; G06F 1/1618; G06F 1/1681; H05K 5/0226; H05K 5/0234
See application file for complete search history.

(56) References Cited

U.S. PATENT DOCUMENTS 5,682,182 A * 10/1997 Tsubosaka .............. G06F 1/166
345/905
9,173,287 B1 * 10/2015 Kim ...................... G06F 1/1681
(Continued)

FOREIGN PATENT DOCUMENTS

CN 108109527 A 6/2018
CN 208190700 U 12/2018
(Continued)

OTHER PUBLICATIONS

Translation of CN 209419660 (Year: 2022).*
Translation of CN 110493375 (Year: 2022).*
Translation of CN 208190700 (Year: 2022).*

Primary Examiner — Hung S. Bui
Assistant Examiner — Sagar Shrestha
(74) Attorney, Agent, or Firm — The Roy Gross Law Firm, LLC; Roy Gross

(57) ABSTRACT

A foldable display device is provided, including a middle frame, a flexible display panel positioned on the middle frame, and a support assembly. The middle frame includes a folding part and non-folding parts positioned at two opposite sides of the folding part. The support assembly is disposed on the back of the middle frame, and buffer strips are disposed around the middle frame. The support assembly includes support frames that are rotatable relative to the
(Continued)

non-folding parts, which can not only prevent holding the display panel by hand or using an external bracket for supporting the display panel, but also prevent damages to the flexible display panel when it is dropped.

16 Claims, 2 Drawing Sheets

(56) References Cited

U.S. PATENT DOCUMENTS

| | | | | |
|---|---|---|---|---|
| 10,117,345 | B2* | 10/2018 | Yamamoto | H05K 5/0008 |
| 10,505,577 | B2* | 12/2019 | Lin | G06F 1/1656 |
| 10,838,458 | B1* | 11/2020 | Park | G06F 1/1681 |
| 11,051,412 | B2* | 6/2021 | Zeng | G06F 1/1656 |
| 2005/0040311 | A1* | 2/2005 | Lee | F16M 13/005 |
| | | | | 248/454 |
| 2013/0258228 | A1* | 10/2013 | Kuo | G02F 1/133308 |
| | | | | 349/58 |
| 2015/0192951 | A1* | 7/2015 | Chong | G02F 1/133305 |
| | | | | 359/894 |
| 2015/0331456 | A1* | 11/2015 | Moon | G06F 1/1656 |
| | | | | 361/679.55 |
| 2018/0146560 | A1 | 5/2018 | Chen et al. | |
| 2019/0227596 | A1* | 7/2019 | Shim | B32B 7/12 |
| 2020/0201385 | A1* | 6/2020 | Choi | G06F 1/1616 |
| 2021/0119171 | A1* | 4/2021 | Kim | H01L 51/0097 |
| 2021/0168929 | A1* | 6/2021 | Wang | H05K 1/028 |

FOREIGN PATENT DOCUMENTS

| | | |
|---|---|---|
| CN | 109413244 A | 3/2019 |
| CN | 209312373 U | 8/2019 |
| CN | 209419660 U | 9/2019 |
| CN | 110493375 A | 11/2019 |
| CN | 210351250 U | 4/2020 |

* cited by examiner

FOLDABLE DISPLAY DEVICE

The present application claims priority of a Chinese patent application filed with the National Intellectual Property Administration on Jun. 24, 2020, application No. 202010590980.0, titled "Foldable display device", which is incorporated by reference in the present application in its entirety.

FIELD OF INVENTION

The application relates to the field of display technology, and in particular to a foldable display device.

BACKGROUND OF INVENTION

With advancements made in flexible panel technology, flexible panels can already be mass-produced, and this provides strong support for design and production of foldable screens. At present, foldable screens and tablets designed by mobile phone/tablet manufacturers are usually fixed by external brackets. If there are no brackets, the mobile phone/tablet will need to be held by hand, making their use more inconvenient. In addition, the current design does not have an excellent anti-drop device in place, so products may be damaged when dropped.

Therefore, it is necessary to improve the current foldable screens.

Technical Problem

The embodiment of the present application provides a foldable display device to solve the technical problem that the current foldable screen is usually fixed by an external bracket and is relatively inconvenient to use.

SUMMARY OF INVENTION

To solve the above problems, the technical solution provided by the present invention is as follows:

The embodiment of the present application provides a foldable display device with a folding area and non-folding areas positioned at opposite two sides of the folding area. The folding display device includes a middle frame, a flexible display panel, and a support assembly. The middle frame includes a folding part and non-folding parts positioned at opposite two sides of the folding part. The folding part is positioned in the folding area, and the non-folding part is positioned in the non-folding area. The flexible display panel is disposed on the middle frame, and the support assembly is disposed on a side of the middle frame away from the flexible display panel. Buffer strips are disposed around the middle frame, and the support assembly includes support frames respectively disposed on the non-folding parts positioned at opposite two sides of the folding part, and the support frames are rotatable relative to the non-folding parts. The non-folding part includes a first side positioned at an edge of the middle frame, the first side is provided with a first buffer strip, and the first buffer strip is positioned in the non-folding area. Four corners of the middle frame are covered with elastic blocks.

In at least one embodiment of this application, an elastic ball and an elastic column connected to the elastic ball are disposed on the non-folding part close to the first side, and the elastic ball is connected to the first buffer strip through the elastic column.

In at least one embodiment of the present application, the non-folding part is provided with a slot, and the elastic ball is positioned in the slot.

In at least one embodiment of the present application, the folding part includes a second side positioned at an edge of the middle frame, the second side is provided with a second buffer strip, and the second buffer strip is positioned in the folding area.

In at least one embodiment of the present application, the non-folding part is provided with a receiving groove, and the support assembly is disposed in the receiving groove.

In at least one embodiment of the present application, the support assembly includes a rotating shaft mounting bracket, a rotating shaft connected to the rotating shaft mounting bracket, and a sleeve.

In at least one embodiment of the present application, the rotating shaft is linked with one end of the support frame, and the support frame rotates around the rotating shaft mounting bracket through the sleeve.

In at least one embodiment of the present application, the non-folding part is rotatably connected with a protective cover, and the protective cover covers the receiving groove.

The embodiment of the present application further provides another foldable display device with a folding area and non-folding areas positioned at opposite two sides of the folding area. The folding display device includes a middle frame, a flexible display panel, and a support assembly. The middle frame includes a folding part and non-folding parts positioned at opposite two sides of the folding part. The folding part is positioned in the folding area, and the non-folding part is positioned in the non-folding area. The flexible display panel is disposed on the middle frame, and the support assembly is disposed on a side of the middle frame away from the flexible display panel. Buffer strips are disposed around the middle frame, and the support assembly includes support frames respectively disposed on the non-folding parts positioned at opposite two sides of the folding part, and the support frames are rotatable relative to the non-folding parts.

In at least one embodiment of the present application, the non-folding part includes a first side positioned at an edge of the middle frame, and the first side is provided with a first buffer strip, the first buffer strip is positioned in the non-folding area.

In at least one embodiment of this application, an elastic ball and an elastic column connected to the elastic ball are disposed on the non-folding part close to the first side, and the elastic ball is connected to the first buffer strip through the elastic column.

In at least one embodiment of the present application, the non-folding part is provided with a slot, and the elastic ball is positioned in the slot.

In at least one embodiment of the present application, the elastic ball and the elastic block are made of silicone.

In at least one embodiment of the present application, the folding part includes a second side positioned at an edge of the middle frame, the second side is provided with a second buffer strip, and the second buffer strip is positioned in the folding area.

In at least one embodiment of the present application, the four corners of the middle frame are covered with elastic blocks.

In at least one embodiment of the present application, the non-folding part is provided with a receiving groove, and the support assembly is disposed in the receiving groove.

In at least one embodiment of the present application, the support assembly includes a rotating shaft mounting bracket, a rotating shaft connected to the rotating shaft mounting bracket, and a sleeve.

In at least one embodiment of the present application, the rotating shaft is linked with one end of the support frame, and the support frame rotates around the rotating shaft mounting bracket through the sleeve.

In at least one embodiment of the present application, the non-folding part is rotatably connected with a protective cover, and the protective cover covers the receiving groove.

In at least one embodiment of the present application, one end of the protective cover corresponding to a fixed end of the support frames is provided with a rotating shaft, the rotating shaft is connected with the receiving groove, the other end of the protective cover is provided with a buckle, and the buckle is buckled with the receiving groove.

Beneficial Effect

By integrating support frames with a foldable display device, holding the device on hand or using an external support assembly for supporting the device can be prevented, thereby making it convenient to use. In addition, the foldable display device is equipped with a series of anti-drop structures, which can prevent damages to the flexible display panel when it is dropped.

DESCRIPTION OF DRAWINGS

In order to more clearly illustrate the technical solutions in the embodiments of the present invention, the following drawings described in the embodiments will be briefly introduced. It is obvious that the drawings described below are merely some embodiments of the present invention, other drawings can also be obtained by the person ordinary skilled in the field based on these drawings without doing any creative work.

DETAILED DESCRIPTION OF PREFERRED EMBODIMENTS

The present application provides a foldable display device. In order to make the objectives, technical solutions, and effects of the present application clear, the present application will be further described in detail below with reference to the accompanying drawings and embodiments. It should be understood that the specific embodiments described here are only used to explain the application, and not used to limit the application.

Figure 1:
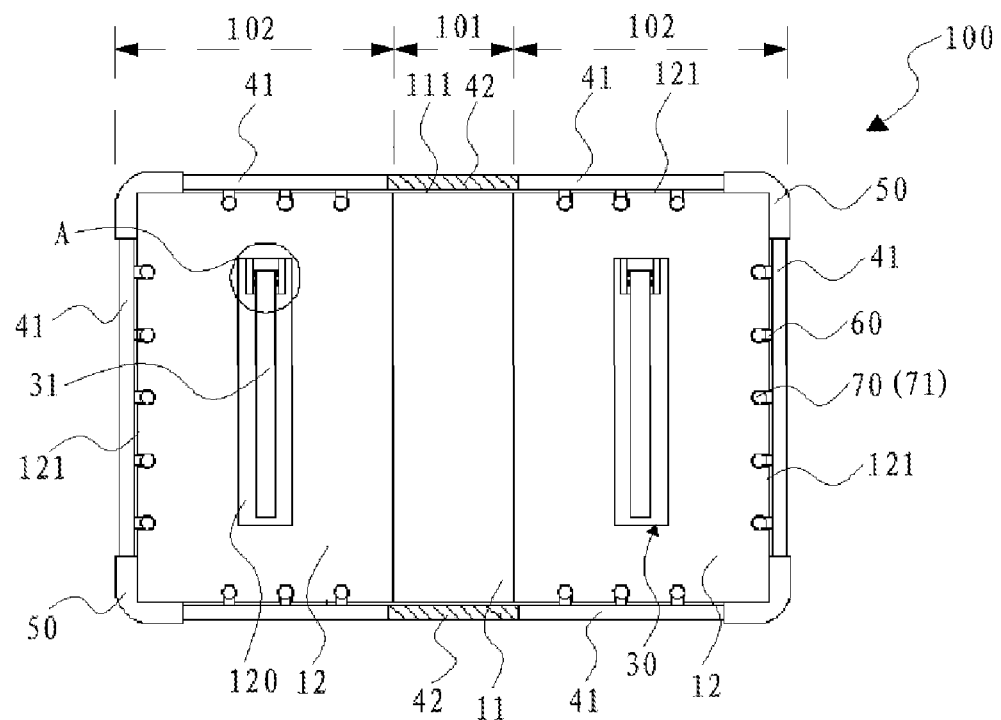
FIG. 1 is a top view of a back side of a foldable display device provided by an embodiment of the present application.
Figure 3:
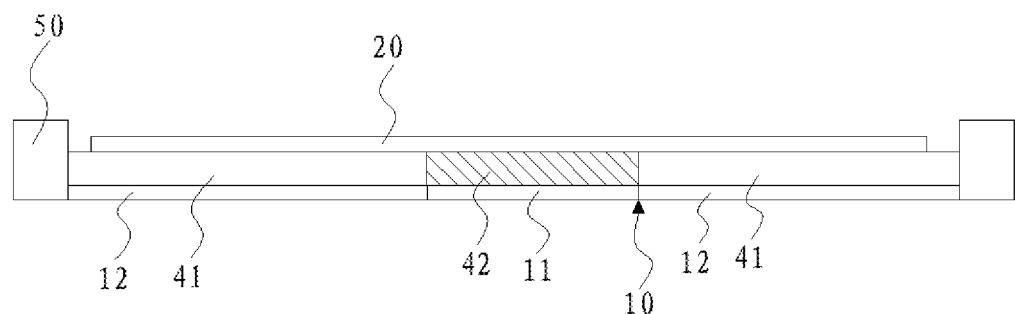
FIG. 3 is a schematic diagram of a side structure of the foldable display device provided by an embodiment of the present application.

As shown in FIG. 1 and FIG. 3, an embodiment of the present application provides a foldable display device 100, wherein a folding area 101 and non-folding areas 102 are defined thereon. The non-folding areas 102 are positioned at two opposite sides of the folding area 101, and the foldable display device 100 includes a middle frame 10, a flexible display panel 20, and a support assembly 30. The flexible display panel 20 is disposed on the middle frame 10 (front side of the middle frame 10), and the support assembly 30 is disposed on a side of the middle frame 10 away from the flexible display panel 20.

Wherein buffer strips are disposed around the middle frame 10 to prevent damage when the foldable display device 100 is accidentally dropped.

The middle frame 10 includes a folding part 11 and non-folding parts 12 positioned at two opposite sides of the folding part 11, wherein the folding part 11 is positioned in the folding area 101, and the non-folding parts 12 are positioned in the non-folding areas 102.

In one embodiment, the folding part 11 and the non-folding parts 12 can be connected by a hinge or can be connected by other methods.

The support assembly 30 is configured to support the entire foldable display device 100. For example, when the foldable display device 100 is a foldable mobile phone or a foldable tablet, the mobile phone or tablet itself can play a supporting role when a user uses the foldable mobile phone or foldable tablet to watch videos, preventing a need to hold the mobile phone or tablet by hand, and providing usage convenience.

The support assembly 30 can be arranged in two groups, each group is respectively positioned on two opposite non-folding parts 12 to increase the stability of the support.

The support assembly 30 includes support frames 31, and the support frames 31 are respectively disposed on the two opposite non-folding parts 12. The support frames 31 are rotatable relative to the non-folding parts 12. When support is needed, the support frames 31 rotate to form certain angles with the non-folding parts 12. When no support is needed, the support frames 31 are retracted and forms a zero-degree angle with the non-folding parts 12.

The non-folding parts 12 include a first side 121, and the first side 121 is positioned at an edge of the middle frame 10, that is, the first side 121 is three sides of the periphery of the non-folding parts 12.

The folding part 11 includes a second side 111, and the second side 111 is positioned at an edge of the middle frame 10, that is, the second side 111 is two opposite sides of the periphery of the folding part 11.

A length and width of the middle frame 10 can be set slightly greater than a length and width of the flexible display panel 20, so that the edge of the middle frame 10 has an accommodating space, which can prevent the flexible display panel 20 from colliding with the edge of the middle frame 10 when folded or unfolded.

In one embodiment, the buffer strips include a first buffer strip 41 and a second buffer strip 42, the first buffer strip 41 is disposed on the first side 121, and the second buffer strip 42 is disposed on the second side 111.

The first buffer strip 41 is positioned in the non-folding areas 102 and the second buffer strip 42 is positioned in the folding area 101.

In one embodiment, the first buffer strip 41 and the second buffer strip 42 can be disposed only on one side of the middle frame 10 or disposed on one side of the middle frame 10 close to the flexible display panel 20. In other embodiments, the first buffer strip 41 and the second buffer strip 42 can also be disposed on both sides of the middle frame 10 to cover an outer edge of the middle frame 10.

In one embodiment, elastic blocks 50 are disposed around the middle frame 10, that is, the two outer corners of the two opposite non-folding parts 12 are respectively provided with elastic blocks, and the elastic blocks 50 cover the four corners of the middle frame 10 to prevent the four corners from being damaged.

In one embodiment, a thickness of the elastic blocks 50 can be set to be slightly thicker than a thickness of the first buffer strip 41 and the second buffer strip 42 so that when a collision occurs, the first buffer strip 41 and the second buffer strip 42 has a buffer space.

In one embodiment, the elastic blocks 50 and the first buffer strip 41 can be made of rubber material. Since the elastic blocks 50 and the first buffer strip 41 protect the outermost edge of the whole machine and do not need to be bent, the elastic blocks 50 and the first buffer strip can be selected from rubber with a slightly higher hardness.

In one embodiment, an elastic ball 70 and an elastic column 60 can be further disposed on the non-folding parts 12. The elastic ball 70 and the elastic column 60 are close to the first side 121. The elastic ball 70 is connected with the elastic column 60, and the elastic column 60 is connected with the first buffer strip 41.

When the folding display device 100 is accidentally dropped, the elastic blocks 50 and the second buffer strips 42 in the folding area 101 can protect the four corners of the device after being folded, and effectively cushion the impact force received when the device drops. The first buffer strips 41 positioned on the four sides also serve as a buffer to the impact force received by the device, and the elastic ball 70 and the elastic column 60 further serve to strengthen the buffering effect of the first buffer strip 41.

In one embodiment, the non-folding parts 12 are provided with a slot 71, and the elastic ball 70 is positioned in the slot 71.

In one embodiment, the elastic ball 70, the elastic column 60, and the second buffer strip 42 can be made of silicone. Since the elastic ball 70, the elastic column 60, and the second buffer strip 42 protect the inside of the whole machine, silicone material with good buffering performance can be selected.

Figure 2:
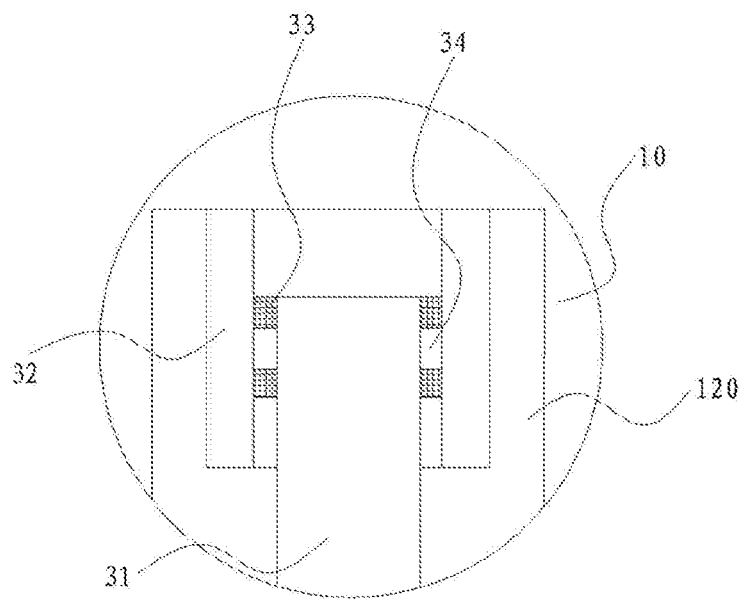
FIG. 2 is an enlarged schematic diagram of a structure at A position in FIG. 1.

As shown in FIG. 2, in one embodiment, the non-folding parts 12 are provided with a receiving groove 120, and the support assembly 30 is positioned in the receiving groove 120 to protect the support assembly. In addition, unevenness of a surface of the middle frame 10 caused by the existence of the support assembly 30 can be prevented.

In one embodiment, the support assembly 30 can include a rotating shaft mounting bracket 32, a rotating shaft 34, and a sleeve 33. The rotating shaft mounting bracket 32 is connected with the rotating shaft 34 to fix the rotating shaft 34. One end of the support frame 31 is linked with the rotating shaft 34 and rotates around the rotating shaft mounting bracket 32 through the sleeve 33.

One end of the support frame 31 connected with the rotating shaft 34 is a fixed end, and the opposite end is a free end, which can be rotated freely.

Figure 4:
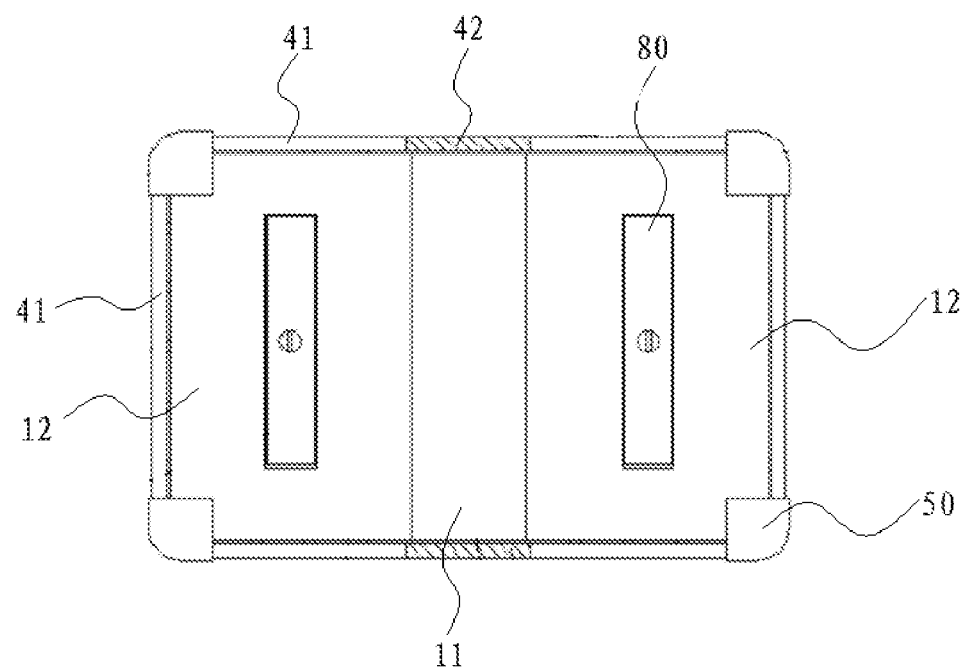
FIG. 4 is another top view of a back side of the foldable display device provided by an embodiment of the present application.

As shown in FIG. 4, in one embodiment, the non-folding parts 12 can also be rotatably connected with a protective cover 80 that covers the receiving groove 120. Since the support frame 31 is positioned in the receiving groove 120, the protective cover 80 can protect the support frame 31.

Specifically, one end of the protective cover 80 corresponding to a fixed end of the support frame 31 is provided with a rotating shaft, the rotating shaft is connected with the receiving groove 120, and the other end of the protective cover is provided with a buckle. When the protective cover 80 covers the receiving groove 120, the buckle is buckled with the receiving groove 120. When the protective cover 80 is opened, its rotation direction is consistent with the rotation direction of the support frame 31, and will not interfere with the support frame 31.

By integrating support frames with a foldable display device, holding or using an external support assembly for supporting the device can be prevented, thereby making it convenient to use. In addition, a series of anti-drop structures are added to the foldable display device, which can prevent damage to the flexible display panel when it is dropped.

It can be understood that for those of ordinary skill in the art, equivalent substitutions or changes can be made according to the technical solutions and inventive concepts of the present application, and these changes or substitutions shall fall within the protection scope of the claims in the present application.

What is claimed is:

1. A foldable display device with a folding area and non-folding areas positioned at two opposite sides of the folding area, comprising:
    a middle frame comprising a folding part and non-folding parts positioned at two opposite sides of the folding part, wherein the folding part is positioned in the folding area, and the non-folding parts are positioned in the non-folding areas, wherein each non-folding part is defined with a receiving groove and is rotatably connected to a protective cover, and the protective cover covers the receiving groove;
    a flexible display panel disposed on the middle frame; and
    a support assembly disposed in the receiving groove on a side of the middle frame away from the flexible display panel;
    wherein, buffer strips are disposed around the middle frame, and the support assembly comprises support frames respectively disposed on the non-folding parts positioned at two opposite sides of the folding part, and the support frames are rotatable relative to the non-folding parts;
    wherein one of the non-folding parts comprises a first side positioned at an edge of the middle frame, the first side is provided with a first buffer strip of the buffer strips, and the first buffer strip is positioned in one of the non-folding areas;
    wherein four corners of the middle frame are covered with elastic blocks; and
    wherein one end of the protective cover corresponding to a fixed end of one of the support frames is provided with a rotating shaft connected to the receiving groove, another end of the protective cover is provided with a buckle, and the buckle is buckled with the receiving groove.

2. The foldable display device according to claim 1, wherein an elastic ball and an elastic column connected to the elastic ball are disposed on the non-folding part close to the first side, and the elastic ball is connected to the first buffer strip through the elastic column.

3. The foldable display device according to claim 2, wherein the non-folding part is provided with a slot, and the elastic ball is positioned in the slot.

4. The foldable display device according to claim 1, wherein the folding part comprises a second side positioned at an edge of the middle frame, the second side is provided with a second buffer strip of the buffer strips, and the second buffer strip is positioned in the folding area.

5. The foldable display device according to claim 1, wherein the non-folding parts are provided with a receiving groove, and the support assembly is disposed in the receiving groove.

6. The foldable display device according to claim 5, wherein the support assembly comprises a rotating shaft mounting bracket, a rotating shaft connected to the rotating shaft mounting bracket, and a sleeve.

7. The foldable display device according to claim 6, wherein the rotating shaft is linked with one end of one of the support frames, and the support frame is rotatable rotate around the rotating shaft mounting bracket through the sleeve.

8. A foldable display device with a folding area and non-folding areas positioned at two opposite sides of the folding area, comprising:
- a middle frame comprising a folding part and non-folding parts positioned at two opposite sides of the folding part, wherein the folding part is positioned in the folding area, and the non-folding parts are positioned in the non-folding areas, wherein each non-folding part is defined with a receiving groove and is rotatably connected to a protective cover, and the protective cover covers the receiving groove;
- a flexible display panel disposed on the middle frame; and
- a support assembly disposed in the receiving groove on a side of the middle frame away from the flexible display panel;
- wherein, buffer strips are disposed around the middle frame, and the support assembly comprises support frames respectively disposed on the non-folding parts positioned at two opposite sides of the folding part, and the support frames are rotatable relative to the non-folding parts; and
- wherein one end of the protective cover corresponding to a fixed end of one of the support frames is provided with a rotating shaft connected to the receiving groove, another end of the protective cover is provided with a buckle, and the buckle is buckled with the receiving groove.

9. The foldable display device according to claim 8, wherein one of the non-folding parts comprises a first side positioned at an edge of the middle frame, the first side is provided with a first buffer strip of the buffer strips, and the first buffer strip is positioned in one of the non-folding areas.

10. The foldable display device according to claim 9, wherein an elastic ball and an elastic column connected to the elastic ball are disposed on the non-folding part close to the first side, and the elastic ball is connected to the first buffer strip through the elastic column.

11. The foldable display device according to claim 10, wherein the non-folding part is provided with a slot, and the elastic ball is positioned in the slot.

12. The foldable display device according to claim 11, wherein the elastic ball and the elastic column are made of silica gel.

13. The foldable display device according to claim 9, wherein the folding part comprises a second side positioned at an edge of the middle frame, the second side is provided with a second buffer strip of the buffer strips, and the second buffer strip is positioned in the folding area.

14. The foldable display device according to claim 8, wherein four corners of the middle frame are covered with elastic blocks.

15. The foldable display device according to claim 8, wherein the support assembly comprises a rotating shaft mounting bracket, a rotating shaft connected to the rotating shaft mounting bracket, and a sleeve.

16. The foldable display device according to claim 5, wherein the rotating shaft is linked with one end of one of the support frames, and the support frame rotate is rotatable around the rotating shaft mounting bracket through the sleeve.

* * * * *